United States Patent
Haran et al.

(10) Patent No.: US 8,629,008 B2
(45) Date of Patent: Jan. 14, 2014

(54) ELECTRICAL ISOLATION STRUCTURES FOR ULTRA-THIN SEMICONDUCTOR-ON-INSULATOR DEVICES

(75) Inventors: Balasubramanian S. Haran, Watervliet, NY (US); David V. Horak, Essex Junction, VT (US); Charles W. Koburger, III, Delmar, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 13/348,018

(22) Filed: Jan. 11, 2012

(65) Prior Publication Data

US 2013/0175622 A1    Jul. 11, 2013

(51) Int. Cl.
   *H01L 21/02*    (2006.01)
(52) U.S. Cl.
   USPC ............................. 438/151; 438/296
(58) Field of Classification Search
   USPC .................. 438/151, 296, 300, 424; 257/347
   See application file for complete search history.

(56) References Cited

U.S. PATENT DOCUMENTS

| | | |
|---|---|---|
| 7,060,546 B2 | 6/2006 | Hsu et al. |
| 7,659,170 B2 | 2/2010 | Schwan et al. |
| 7,659,579 B2 | 2/2010 | Anderson et al. |
| 7,838,353 B2 | 11/2010 | Anderson et al. |
| 7,872,295 B2 | 1/2011 | Park et al. |
| 8,383,490 B2 * | 2/2013 | Fan et al. ...................... 438/424 |
| 2010/0258869 A1 | 10/2010 | Morita et al. |

* cited by examiner

*Primary Examiner* — Mark Prenty
(74) *Attorney, Agent, or Firm* — Scully, Scott, Murphy & Presser, P.C.; Joseph Petrokaitis

(57) ABSTRACT

After formation of raised source and drain regions, a conformal dielectric material liner is deposited within recessed regions formed by removal of shallow trench isolation structures and underlying portions of a buried insulator layer in a semiconductor-on-insulator (SOI) substrate. A dielectric material that is different from the material of the conformal dielectric material liner is subsequently deposited and planarized to form a planarized dielectric material layer. The planarized dielectric material layer is recessed selective to the conformal dielectric material liner to form dielectric fill portions that fill the recessed regions. Horizontal portions of the conformal dielectric material liner are removed by an anisotropic etch, while remaining portions of the conformal dielectric material liner form an outer gate spacer. At least one contact-level dielectric layer is deposited. Contact via structures electrically isolated from a handle substrate can be formed within the contact via holes.

11 Claims, 11 Drawing Sheets

ELECTRICAL ISOLATION STRUCTURES FOR ULTRA-THIN SEMICONDUCTOR-ON-INSULATOR DEVICES

BACKGROUND

The present disclosure relates to semiconductor structures, and particularly to electrical isolation structures for ultra-thin semiconductor-on-insulator (UTSOI) devices and methods of manufacturing the same.

Ultra-thin semiconductor-on-insulator (UTSOI) devices refer to semiconductor devices formed on an ultra-thin semiconductor-on-insulator (UTSOI) substrate. A UTSOI substrate can be employed to form various semiconductor devices that derive performance advantage through the reduced thickness of the top semiconductor layer and/or the reduced thickness of the buried insulator layer compared with normal semiconductor-on-insulator (SOI) substrate.

For example, the reduction in the thickness of the top semiconductor layer provides full depletion of the channel, thereby enhancing the electrical control of the channel by the gate electrode and reducing the leakage current in a field effect transistor. Further, the reduction in the thickness of the buried insulator layer can enhance control by a back gate electrode in back-gated field effect transistors.

While UTSOI devices, and especially UTSOI field effect transistors (FETs), are promising candidates for advanced high performance devices, several manufacturing issues need to be resolved before UTSOI devices can be manufactured with high yield. One such issue is erosion of shallow trench isolation structures that are employed to provide lateral electrical isolation between adjacent devices. Specifically, etch steps and/or cleaning steps are repeatedly employed to recess various material layers and/or to clean surfaces before further processing. Shallow trench isolation structures can be etched during such etch steps and/or cleaning steps. Further, underlying portions of the buried insulator layer can be eroded to a degree that a hole is formed underneath a cavity formed by removal of the shallow trench isolation structure and a top surface of a handle substrate is exposed underneath the hole. For example, silicon oxide-based shallow trench isolation structures are susceptible to HF-based etches that can be employed to preclean semiconductor surfaces before epitaxy or formation of a gate dielectric.

Such holes in the buried insulator layer can cause severe yield problems during formation of contacts to source and drain regions. For example, contact via holes can straddle over a sidewall around a hole such that a top surface of the handle substrate, which is typically a semiconductor substrate, is physically exposed at the bottom of the hole in addition to physically exposed surfaces of a source region or a drain region located in or above the top semiconductor layer. A direct electrical short can be formed between the bottom semiconductor layer and the source region or the drain region by a conductive material that is deposited in the hole to form a contact via structure.

Thus, a method of ensuring sufficient electrical isolation between a bottom semiconductor layer of a UTSOI substrate and electrical nodes in a top semiconductor layer of the UTSOI substrate despite the erosion of shallow trench isolation structures and portions of a buried insulator layer during processing steps is needed to provide functional and reliable UTSOI devices.

BRIEF SUMMARY

After formation of raised source and drain regions, a conformal dielectric material liner is deposited within recessed regions formed by removal of shallow trench isolation structures and underlying portions of a buried insulator layer in a semiconductor-on-insulator (SOI) substrate. A dielectric material that is different from the material of the conformal dielectric material liner is subsequently deposited and planarized to form a planarized dielectric material layer. The planarized dielectric material layer is recessed selective to the conformal dielectric material liner to form dielectric fill portions that fill the recessed regions below a top surface of a top semiconductor layer. Horizontal portions of the conformal dielectric material liner are removed by an anisotropic etch, while remaining portions of the conformal dielectric material liner form an outer gate spacer. At least one contact-level dielectric layer is deposited. Contact via holes are formed in the at least one contact-level dielectric layer employing an etch chemistry that is selective to the dielectric fill portions. Contact via structures electrically isolated from a handle substrate is formed within the contact via holes.

According to an aspect of the present disclosure, a method of forming a semiconductor structure is provided, which includes: forming a gate stack and a gate spacer laterally surrounding the gate stack on a top semiconductor layer in a semiconductor-on-insulator (SOI) substrate; performing at least one processing step on the SOI substrate after forming the gate spacer, wherein at least one recessed region having a bottom surface below a level of a bottommost surface of the top semiconductor layer is formed through a portion of the top semiconductor layer and at least in an upper portion of a buried insulator layer in the SOI substrate; forming a dielectric material liner on sidewalls and a bottom surface of the at least one recessed region and over the gate spacer and the gate stack; and forming at least one dielectric fill portion that fills the recessed region at least above the level of the bottommost surface of the top semiconductor layer.

According to another aspect of the present disclosure, a semiconductor structure is provided, which includes: a semiconductor material portion located within a top semiconductor layer in a semiconductor-on-insulator (SOI) substrate; a dielectric material liner laterally contacting a sidewall of the semiconductor material portion and a sidewall of at least an upper portion of a buried insulator layer within the SOI substrate; at least one dielectric fill portion filling a volume inside the dielectric material liner and including a first dielectric material; a contact-level dielectric layer in contact with the at least one dielectric fill portion and the dielectric material liner and including a second dielectric material that is different from the first dielectric material; and a contact via structure in contact with a component of a device on the top semiconductor layer, the dielectric material liner, the at least one dielectric fill portion, and the contact-level dielectric layer, wherein an interface between the contact via structure and the at least one dielectric fill portion is coplanar with an interface between the contact via structure and the contact-level dielectric layer.

DETAILED DESCRIPTION

Figure 1:
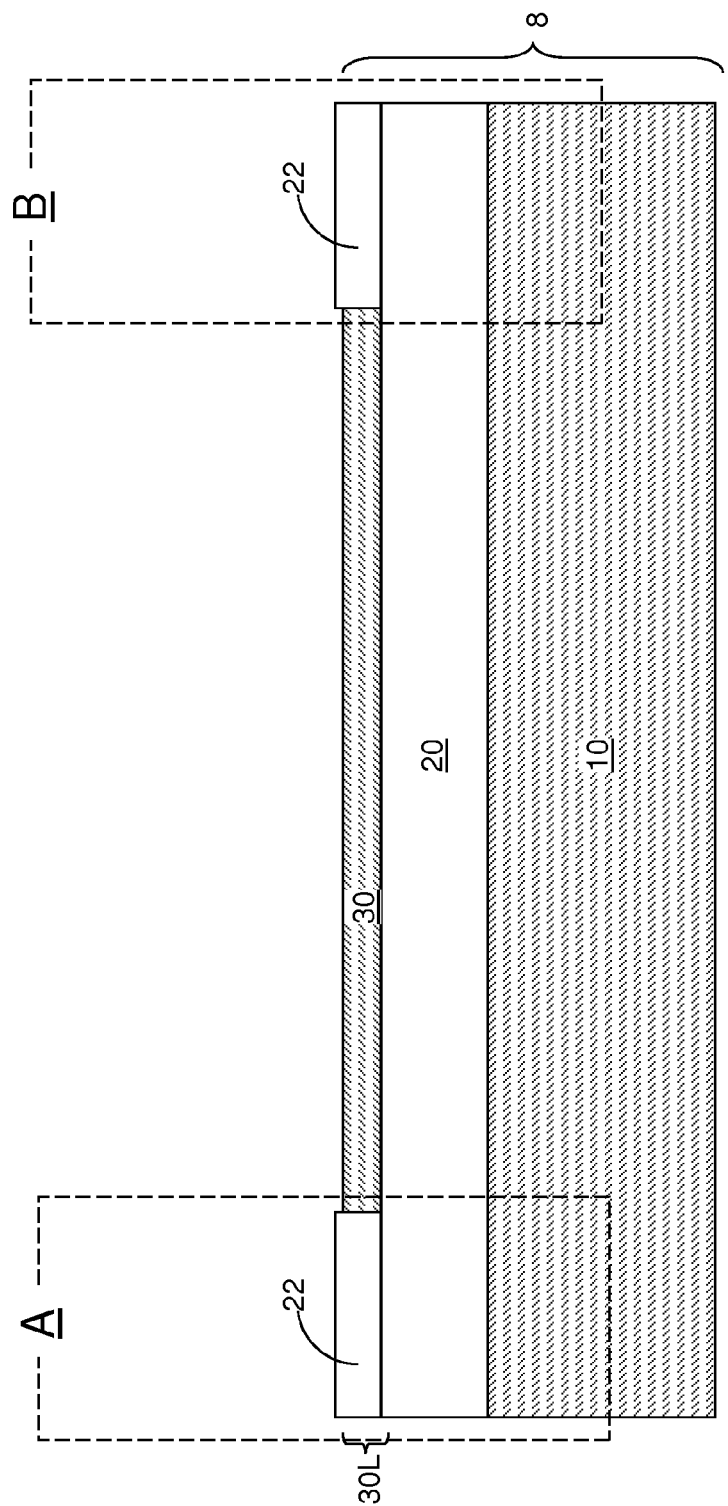
FIG. 1 is a vertical cross-sectional view of an exemplary semiconductor structure after formation of shallow trench isolation structures according to an embodiment of the present disclosure.

As stated above, the present disclosure relates to electrical isolation structures for ultra-thin semiconductor-on-insulator (UTSOI) devices and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, an exemplary semiconductor structure according to an embodiment of the present disclosure includes a semiconductor-on-insulator (SOI) substrate 8. The SOI substrate 8 includes a vertical stack of a handle substrate 10, a buried insulator layer 20, and a top semiconductor layer 30L.

The handle substrate 10 can include a semiconductor material, a dielectric material, a conductive material, or a combination thereof. For example, the handle substrate 10 can be a single crystalline silicon substrate. The buried insulator layer 20 includes a dielectric material such as silicon oxide, silicon nitride, silicon oxynitride, or a combination thereof. The top semiconductor layer 30L includes a semiconductor material such as silicon, germanium, a silicon-germanium alloy, a III-V compound semiconductor, a II-VI compound semiconductor, any other semiconductor material known in the art, or combinations thereof. The semiconductor material in the top semiconductor layer 30L can be single crystalline.

In one embodiment, the semiconductor SOI substrate 8 can be an ultra-thin semiconductor-on-insulator (UTSOI) substrate. The top semiconductor layer 30L of a typical UTSOI substrate 8 is also referred to as an ultra-thin semiconductor-on-insulator (UTSOI) layer, and has a thickness from 3 nm to 15 nm. The buried insulator layer underneath the top semiconductor layer 30L of a UTSOI substrate can have a thickness from 5 nm to 50 nm.

At least one shallow trench isolation structure 22 can be formed in the top semiconductor layer 30L by replacing a portion of the top semiconductor layer 30L with a dielectric material. For example, shallow trenches can be formed in the top semiconductor layer 30L, and are subsequently filled with a dielectric material such as silicon oxide, silicon nitride, silicon oxynitride, or a combination thereof. Excess dielectric material above the top surface of the top semiconductor layer 30L can be removed by a planarization process such as chemical mechanical planarization (CMP) to form the at least one shallow trench isolation structure 22. The at least one shallow trench isolation structure 22 can laterally surround and enclose a portion of the top semiconductor layer 30L, which is herein referred to as a top semiconductor portion 30. Each top semiconductor portion 30 constitutes an active region on which semiconductor devices can be subsequently formed.

The at least one shallow trench isolation structure 22 can be formed in a shallow trench laterally that laterally surrounds, and electrically isolates, a top semiconductor portion 30. In one embodiment, a top surface of the at least one shallow trench isolation structure 22, as formed by planarization and any recessing, can be substantially coplanar with the top surface of the top semiconductor portion 30. As used herein, a first element is "substantially coplanar" with a second element if the coplanarity between the first element and the second element is limited only by the capability of the processing steps that intend to make the surfaces of the first element and the second element coplanar with each other. Practically, the top surface of the at least one shallow trench isolation structure 22 can be coplanar with the top surface of the top semiconductor portion 30 within ½ of the thickness of the top semiconductor portion 30. Alternatively, the top surface of the at least one shallow trench isolation structure 22 can be raised above the top surface of the top semiconductor portion 30.

A first representative region A including a first portion of the at least one shallow trench isolation structure 22 and a second representative region B including a second portion of the at least one shallow trench isolation structure 22 are illustrated in FIG. 1. The first representative region A and the second representative region B are representative of various regions in the exemplary semiconductor structure including the at least one shallow trench isolation structure 22 at this processing step.

Figure 2:
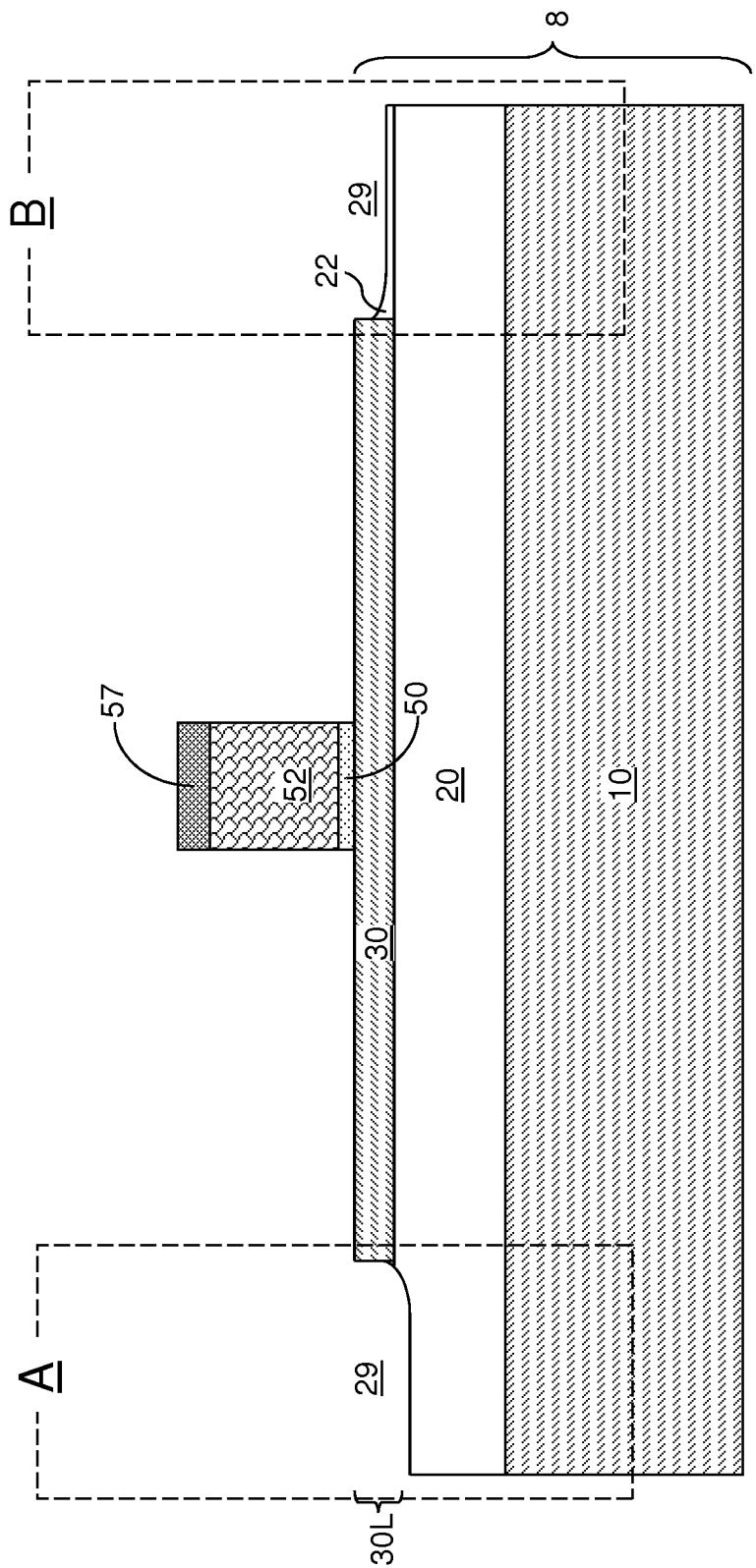
FIG. 2 is a vertical cross-sectional view of the exemplary semiconductor structure after formation of a gate stack and accompanying collateral etch of the shallow trench isolation structures according to an embodiment of the present disclosure.

Referring to FIG. 2, a semiconductor device is subsequently formed on the semiconductor SOI substrate 8. The semiconductor device can be any semiconductor device as known in the art.

In one embodiment, the semiconductor device can be a field effect transistor. In this embodiment, a gate stack including a gate dielectric 50, a gate conductor 52, and a gate cap dielectric 57 can be formed, for example, by deposition of a gate dielectric layer, a gate conductor layer, and a gate cap dielectric layer, and lithographic patterning of the gate cap dielectric layer, the gate conductor layer, and the gate dielectric layer.

The gate dielectric 50 includes a dielectric material, which can be silicon oxide, silicon nitride, silicon oxynitride, or a stack thereof. Alternately, the gate dielectric 50 can be a high dielectric constant (high-k) material layer having a dielectric constant greater than 8.0. In one embodiment, the gate dielectric 50 can include a dielectric metal oxide, which is a high-k material containing a metal and oxygen, and such metal oxides are known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

The gate conductor 52 includes a conductive material, which can be a doped semiconductor material, a metallic material, or a combination thereof. The doped semiconductor material can include doped polysilicon, doped polycrystalline germanium, a doped silicon-germanium alloy, or any other doped semiconductor material. The metallic material, if employed, can be selected to optimize the performance of a transistor to be subsequently formed. The gate conductor 52 can be deposited, for example, by chemical vapor deposition (CVD) and/or physical vapor deposition and/or any other deposition methods available in the art.

The gate cap dielectric 57 includes a dielectric material such as silicon nitride, silicon oxide, organosilicate glass (OSG), a high dielectric constant (high-k) material, a dielectric metal oxide, a dielectric metal nitride, or a combination thereof.

Formation of the gate stack (50, 52, 57) employs at least one anisotropic etch and optional cleaning steps that are performed before, or after, the at least one anisotropic etch. The optional cleaning steps can employ an isotropic etch such as a wet etch. A collateral etch accompanies the at least one anisotropic etch and the optional cleaning steps. The collateral etch is the etch of dielectric material of the at least one shallow trench isolation structure 22 and any physically exposed portions of the buried insulator layer 20 that is performed concurrently with the at least one anisotropic etch or with the optional cleaning steps by the same etch chemistry/chemistries used for the at least one anisotropic etch and the optional cleaning steps. The collateral etch forms a recessed region 29 above each remaining portion of the at least one shallow trench isolation structure 22 and above each physically exposed surfaces of the buried insulator layer 20.

In one embodiment, an entirety of a shallow trench isolation structure 22 can be removed to physically expose, and partially etch, the buried insulator layer 20 as in the first representative region A, or an upper portion of a shallow trench isolation structure 22 can be removed while a remaining portion of the shallow trench isolation structure 22 overlies the buried insulator layer 20 as in the second representative region B. The bottommost surface of the recessed region 29 in the first representative region A is located below the level of the interface between the top semiconductor layer 30L and the buried insulator layer 20. The bottommost surface of the recessed region in the second representative region B can be located above the level of the interface between the top semiconductor layer 30L and the buried insulator layer 20.

It is noted that in some embodiments, all regions including the at least one shallow trench isolation structure 22 can have the configuration of the first representative region A. In some other embodiments, all regions including the at least one shallow trench isolation structure 22 can have the configuration of the second representative region B. In yet other embodiments, some regions of the at least one shallow trench isolation structure 22 can have the configuration of the first representative region A and some other regions of the at least one shallow trench isolation structure 22 can have the configuration of the second representative region B due to within-substrate process non-uniformity.

Optionally, gate sidewall spacers (not shown), can be formed, for example, by thermal conversion or plasma conversion of the surface portions of the gate conductor. The thermal conversion or the plasma conversion can be oxidation, nitridation, or a combination thereof. For example, the gate conductor 52 can include a doped semiconductor material such as doped polysilicon, and the gate sidewall spacers can include an oxide or a nitride of the doped semiconductor material of the gate conductor 52.

Figure 3:
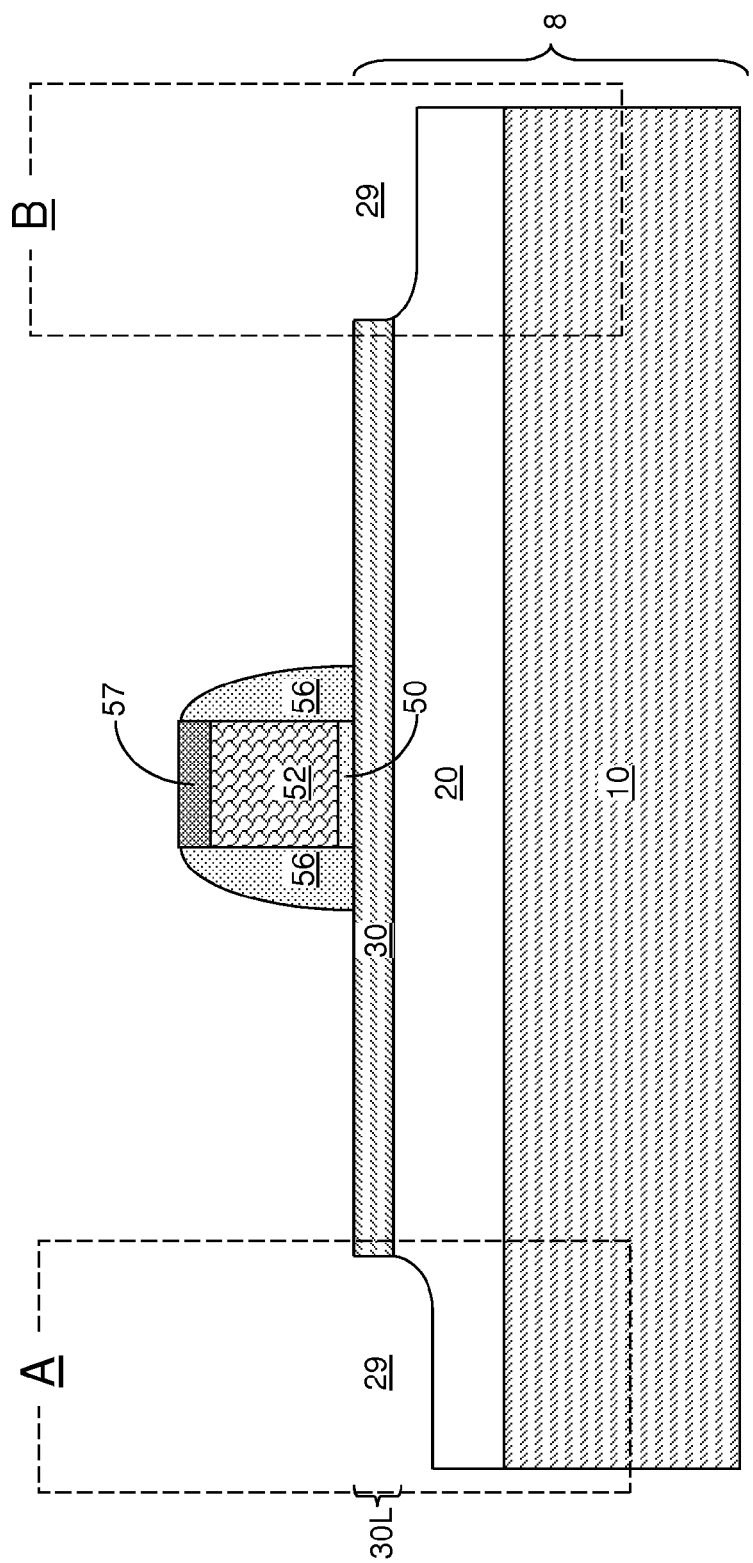
FIG. 3 is a vertical cross-sectional view of the exemplary semiconductor structure after formation of a gate spacer and accompanying additional collateral etch of the shallow trench isolation structures and physically exposed portions of a buried insulator layer according to an embodiment of the present disclosure.

Referring to FIG. 3, a gate spacer 56 can be formed around the gate stack (50, 52, 57), for example, by deposition of a conformal dielectric layer and an anisotropic etch of the conformal dielectric layer. The gate spacers 56 include a dielectric material such as silicon oxide, silicon nitride, or a combination thereof. The gate spacers 56 can be formed, for example, by deposition of a conformal dielectric layer followed by an anisotropic etch that removes horizontal portions of the conformal dielectric layer. The remaining vertical portions of the conformal dielectric layer are the gate spacers 56.

Various cleaning steps, wet etch steps, and dry etch steps (e.g., anisotropic etches employing a reactive ion etch process) are employed between the formation of the at least one shallow trench isolation structure 22 and the last processing step for formation of the gate spacers 56. As a consequence, the top surfaces of the shallow trench isolation structures 22 are gradually recessed below the top surface of the buried insulator layer 20 in the case of a UTSOI substrate.

For example, the anisotropic etch that is employed to form the gate spacer 56 accompanies an additional collateral etch of any remaining portions of the at least one shallow trench isolation structure 22 and physically exposed portions of the buried insulator layer 20.

In one embodiment, all remaining portions of the at least one shallow trench isolation structure 22 can be removed by the additional collateral etch in the recessed regions 29. Thus, the bottommost surfaces of the recessed regions 29 can be located below the level of the bottommost surface of the top semiconductor layer 30L. The recessed regions 29 can extend through the entire thickness of the top semiconductor layer 30L and at least in the upper portion of the buried insulator layer 20. In this case, the recessed regions 29 can include the entirety of the volumes previously occupied by the at least one shallow trench isolation structure 22.

Figure 4:
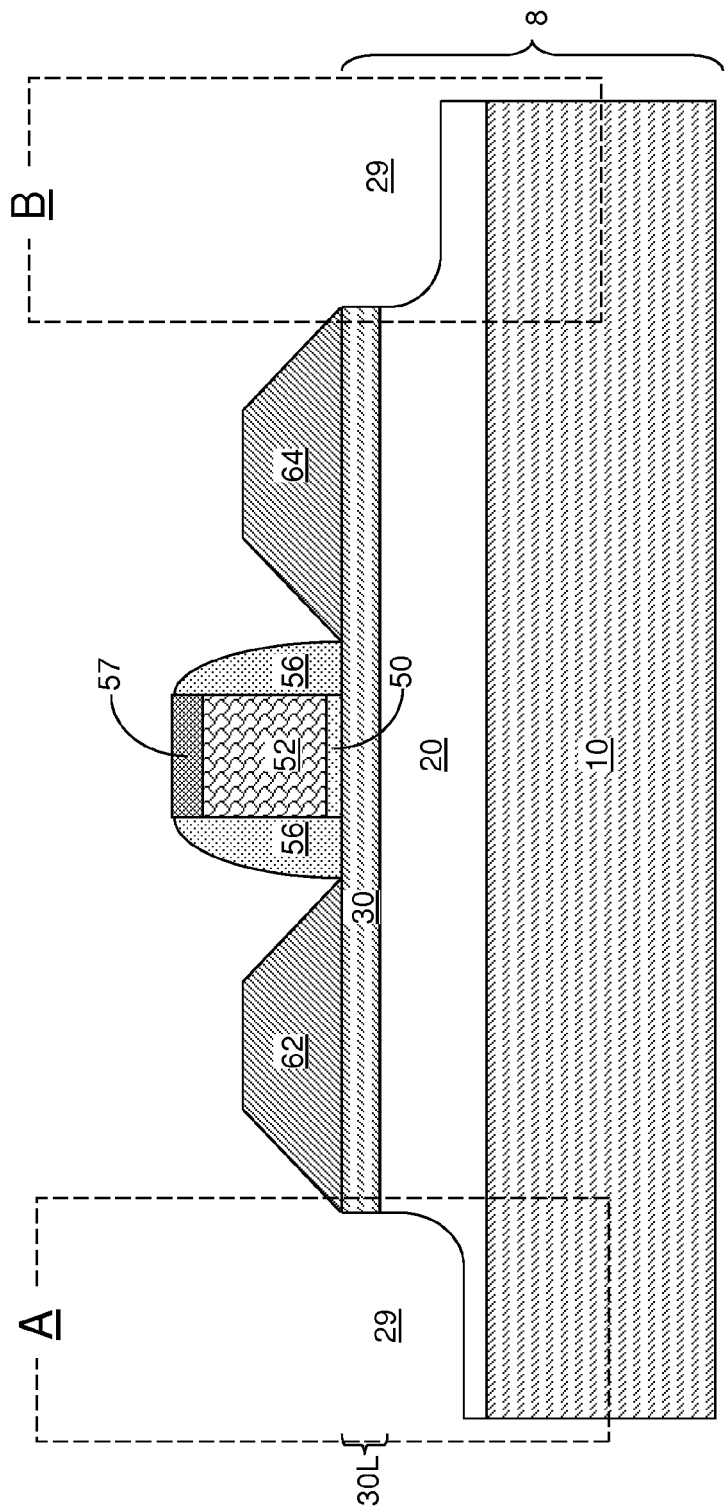
FIG. 4 is a vertical cross-sectional view of the exemplary semiconductor structure after a preclean and subsequent selective deposition of a raised source region and a raised drain region according to an embodiment of the present disclosure.

Referring to FIG. 4, at least one processing step can be performed on the SOI substrate 8 after forming the gate spacer 56. The recessed regions 29 expand in volume during such at least one processing step as a result of at least one collateral etch that occurs during a wet clean of a surface, selective removal of a material by a wet etch, and/or an anisotropic etch. The recessed regions 29 can have a bottom surface below the level of the bottommost surface of the top semiconductor layer 30L, i.e., below the level of the interface between the top semiconductor portion 30 and the buried insulator layer 20. Each recessed region 29 thus extends through a portion of the top semiconductor layer 30 and at least into an upper portion of the buried insulator layer 20 in said SOI substrate 8. In one embodiment, a recessed region 29 can contiguously surround a top semiconductor portion 30 laterally. For example, the top semiconductor portion illustrated in FIG. 4 can be laterally surrounded by a single contiguous recessed region 29 that includes the area of the first representative region A and the second representative region B.

In one embodiment, the at least one processing step can include, for example, a preclean process and a subsequent selective deposition process that deposits a semiconductor material on semiconductor surfaces, while not depositing the semiconductor material on any dielectric surface. The preclean process can be, for example, a hydrofluoric acid (HF) wet etch, which removes silicon oxide from top surfaces of the top semiconductor portion 30. The HF wet etch accompanies a collateral etch of the physically exposed portions of the buried insulator layer 20 if the buried insulator layer 20 includes silicon oxide. Thus, the bottom surfaces of the recessed regions 29 are further recessed downward. The recessed bottom surfaces of the recessed regions 29 may, or may not, reach the top surface of the handle substrate 10 depending on the amount of silicon oxide etched from the buried insulator layer 20.

During the selective deposition process, a semiconductor material is deposited on semiconductor surfaces of the top semiconductor portion 30 within the top semiconductor layer 30L, and is not deposited on dielectric surfaces. The selective deposition process can be, for example, a selective epitaxy process in which a single crystalline semiconductor material is deposited on single crystalline semiconductor surfaces.

For example, the top semiconductor portion 30 can include a single crystalline semiconductor material such as single crystalline silicon, a single crystalline silicon-germanium alloy, a single crystalline silicon-carbon alloy, a single crystalline III-V compound semiconductor material, or a single crystalline II-VI compound semiconductor material. A raised source region 62 and a raised drain region 64 can be formed in epitaxial alignment of the underlying single crystalline lattice of the top semiconductor portion 30. The raised source region 62 and the raised drain region 64 include a semiconductor material that is lattice-matched with the semiconductor material of the top semiconductor portion 30. For example, the raised source region 62 and the raised drain region 64 can include any of single crystalline silicon, a single crystalline silicon-germanium alloy, a single crystalline silicon-carbon alloy, a single crystalline III-V compound semiconductor material, and a single crystalline II-VI compound semiconductor material, provided that lattice mismatch between the semiconductor material of the raised source region 62 and the raised drain region 64 and the semiconductor material of the top semiconductor portion 30 is small enough to enable selective epitaxy.

The raised source region 62 and the raised drain region 64 are doped with electrical dopant of p-type or n-type. P-type electrical dopants include, for example, B, Ga, and In, and n-type dopants include, for example, P, As, and Sb. The raised source region 62 and the raised drain region 64 are located on opposite sides of the assembly of the gate stack (50, 52, 57) and the gate spacers 56. Electrical dopants can be introduced into the raised source region 62 and the raised drain region 64 during the selective deposition process by in-situ doping, or can be introduced into the raised source region 62 and the raised drain region 64 after selective epitaxy by ion implantation or plasma doping. In one embodiment, a single contiguous recessed region 29 can laterally surround an assembly of a top semiconductor portion 30, a gate stack (50, 52, 57) thereupon, a gate spacer 56 around the gate stack (50, 52, 57), the raised source region 62, and the raised drain region 64.

Figure 5:
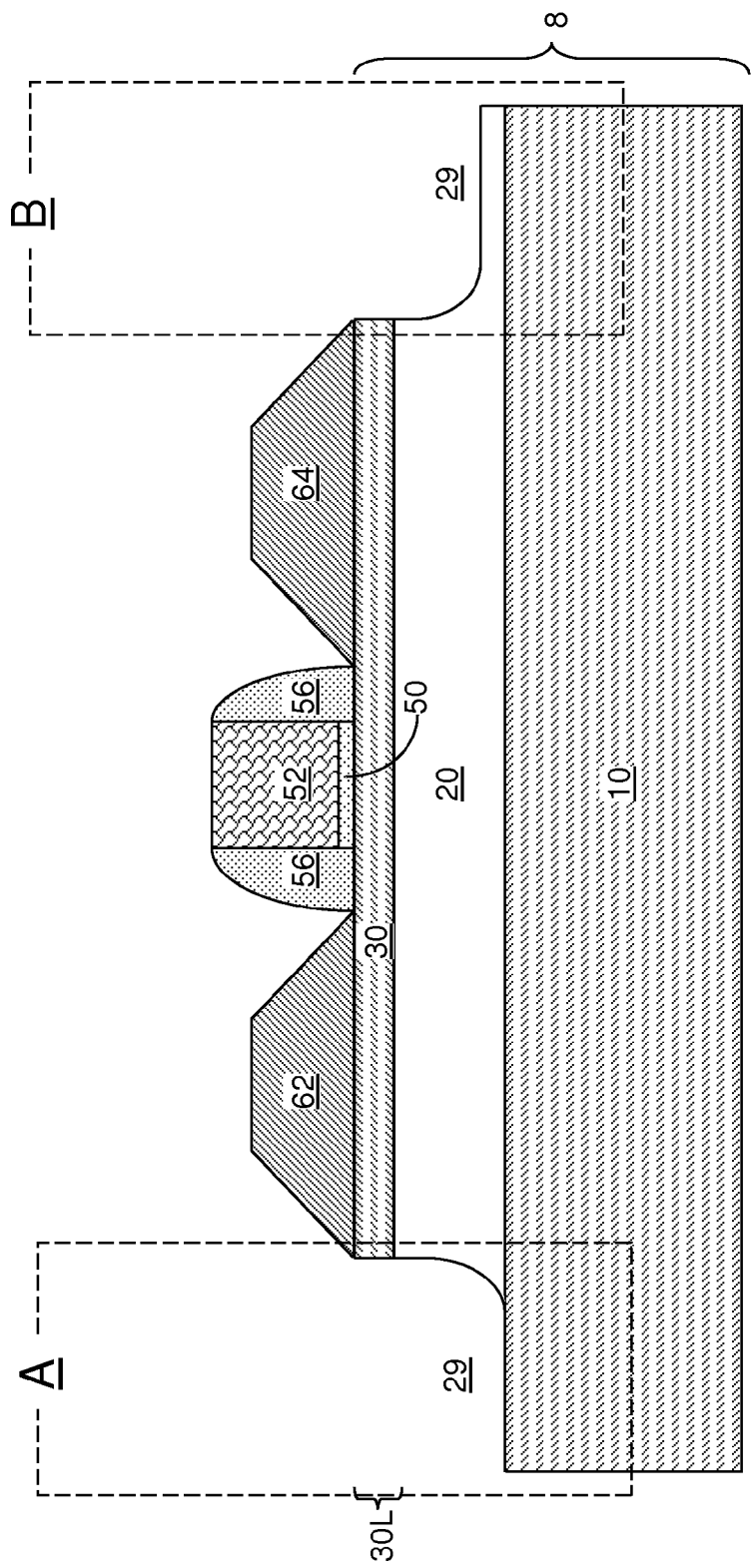
FIG. 5 is a vertical cross-sectional view of the exemplary semiconductor structure after a postclean according to an embodiment of the present disclosure.

Referring to FIG. 5, a postclean may be optionally performed after the selective deposition process. Various configurations can be provided depending on the amount of removal of the physically exposed portions of the buried insulator layer 20 caused by the cumulative collateral etches. The postclean can be a wet etch or a dry etch such as a reactive ion etch. The gate cap dielectric 57 and an upper portion of the gate spacer 56 are removed during the postclean.

Some or all of recessed regions 29 can have a bottom surface at, or below, the level of the bottommost surface of the buried insulator layer 20 as illustrated in the configuration of the first representative region A. A surface of the handle substrate 10 is physically exposed at the bottom of such recessed regions 29. The configuration in which a bottom surface of a recessed region 29 is below the level of the bottommost surface of the buried insulator layer 20 can be caused by collateral erosion of the top surface of the handle substrate 10.

Alternately or additionally, some or all of recessed regions 29 can have a bottom surface above the level of the bottommost surface of the buried insulator layer 20 as illustrated in the configuration of the first representative region B. The bottommost surface of such recessed regions 29 is located above, and is vertically spaced from, the top surface of the handle substrate 10.

Figure 6:
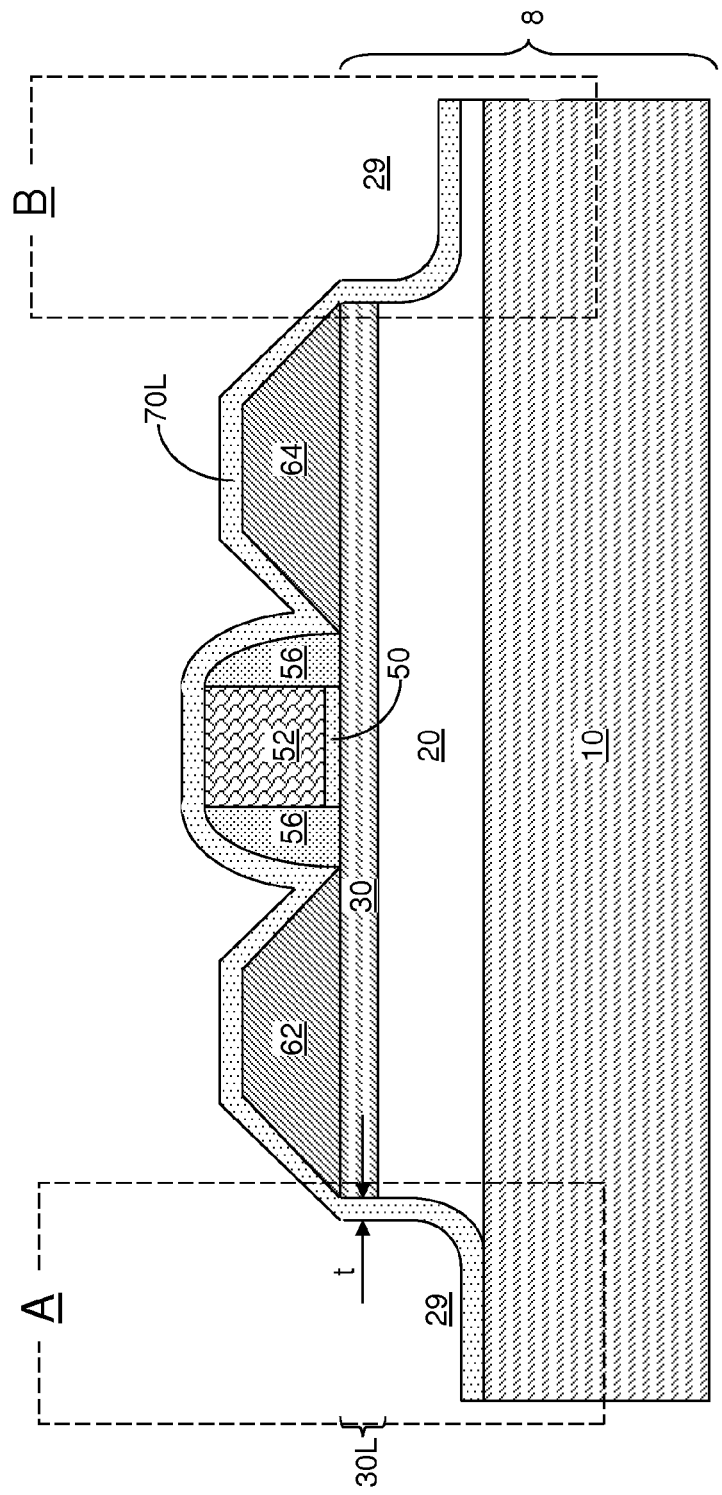
FIG. 6 is vertical cross-sectional view of the exemplary semiconductor structure after deposition of a conformal dielectric material liner according to an embodiment of the present disclosure.

Referring to FIG. 6, a contiguous dielectric material liner 70L is deposited on the physically exposed surfaces of the handle substrate 10, the buried insulator layer 20, the top semiconductor layer 30, the raised source region 62, the raised drain region 64, the gate electrode 52, and the gate spacer 56. Thus, the contiguous dielectric material liner 70L is deposited on sidewalls and bottom surfaces of the recessed regions 29. In one embodiment, the contiguous dielectric material liner 70L can be deposited by a conformal deposition process such as chemical vapor deposition (CVD) or atomic layer deposition (ALD) or molecular layer deposition (MLD). In this case, the contiguous dielectric material liner 70L can be a conformal dielectric material liner.

The contiguous dielectric material liner 70L includes a dielectric material such as a dielectric metal oxide, silicon nitride, or a combination thereof. The thickness t of the contiguous dielectric material liner 70L, as measured at the sidewall contacting the top semiconductor portion 30, can be from 2 nm to 20 nm, although lesser and greater thicknesses can also be employed. The contiguous dielectric material liner 70L is not self-planarizing, and the topography of the top surface of the contiguous dielectric material liner 70L replicates the topography of the top surfaces of underlying structures.

Figure 7:
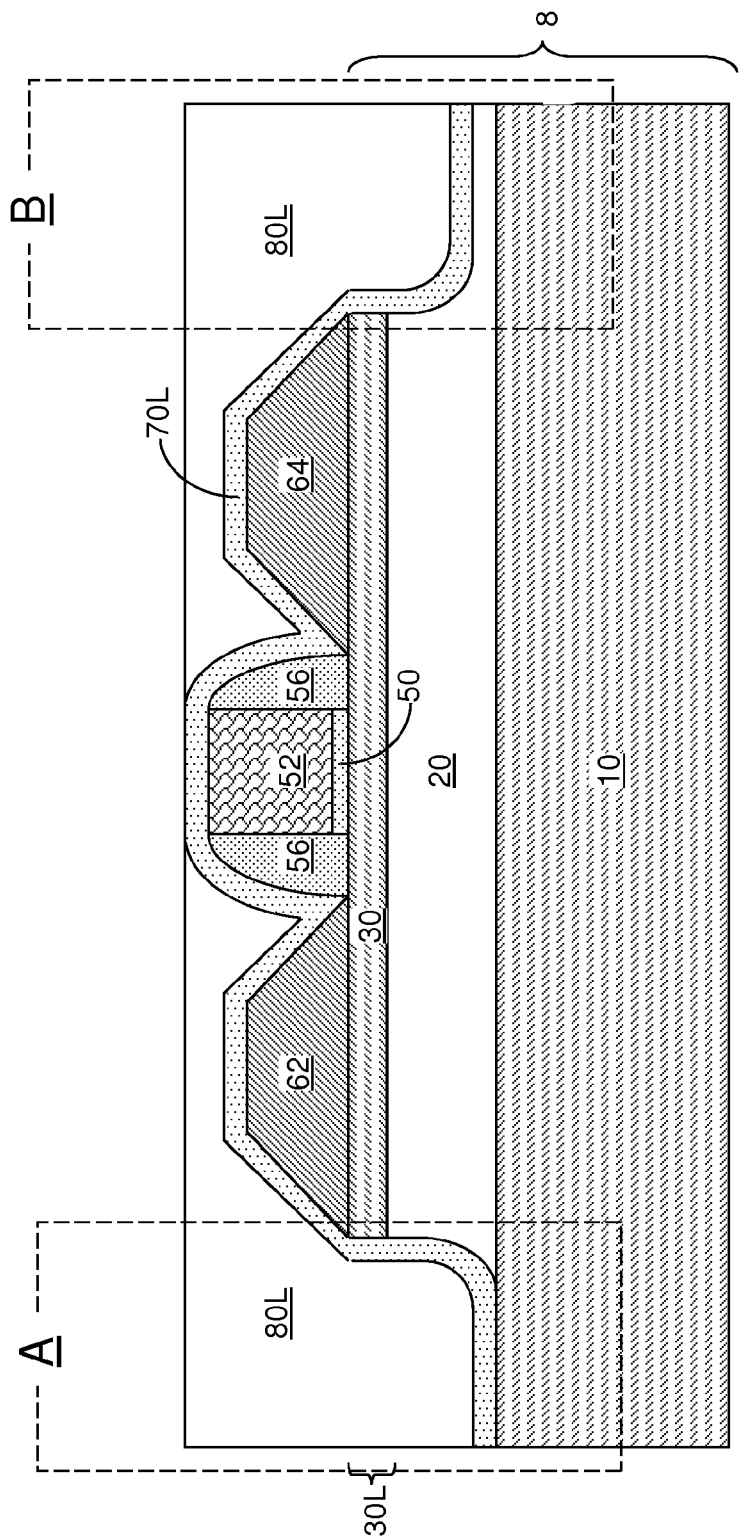
FIG. 7 is a vertical cross-sectional view of the exemplary semiconductor after deposition of a dielectric material and planarization of the dielectric material to form a planarized dielectric material layer according to an embodiment of the present disclosure.

Referring to FIG. 7, a dielectric material layer including a first dielectric material is deposited and planarized to form a planarized dielectric material layer 80L. The first dielectric material can be different from the dielectric material of the contiguous dielectric material liner 70L. For example, the first dielectric material can be doped silicon oxide (i.e., doped silicate glass) or undoped silicon oxide (i.e., undoped silicate glass).

The deposition and planarization of the dielectric material can be simultaneous if the material of the planarized dielectric material layer 80L is self-planarizing (e.g., spin-on glass (SOG)). Alternately, the deposition of the dielectric material can precede the planarization of the dielectric material. For example, if the dielectric material includes an undoped silicate glass (USG) or a doped silicate glass (such as fluorosilicate glass, phosphosilicate glass, or borosilicate glass) that is deposited by chemical vapor deposition, planarization of the dielectric material can be effected by chemical mechanical planarization that employs the topmost portion of the contiguous dielectric material liner 70L as a stopping layer. The topmost portion of the contiguous dielectric material liner 70L can be located above the gate electrode 52, the raised source region 62, and/or the raised drain region 64. The recessed regions 29 are completely filled with the first dielectric material upon formation of the planarized dielectric material layer 80L.

Figure 8:
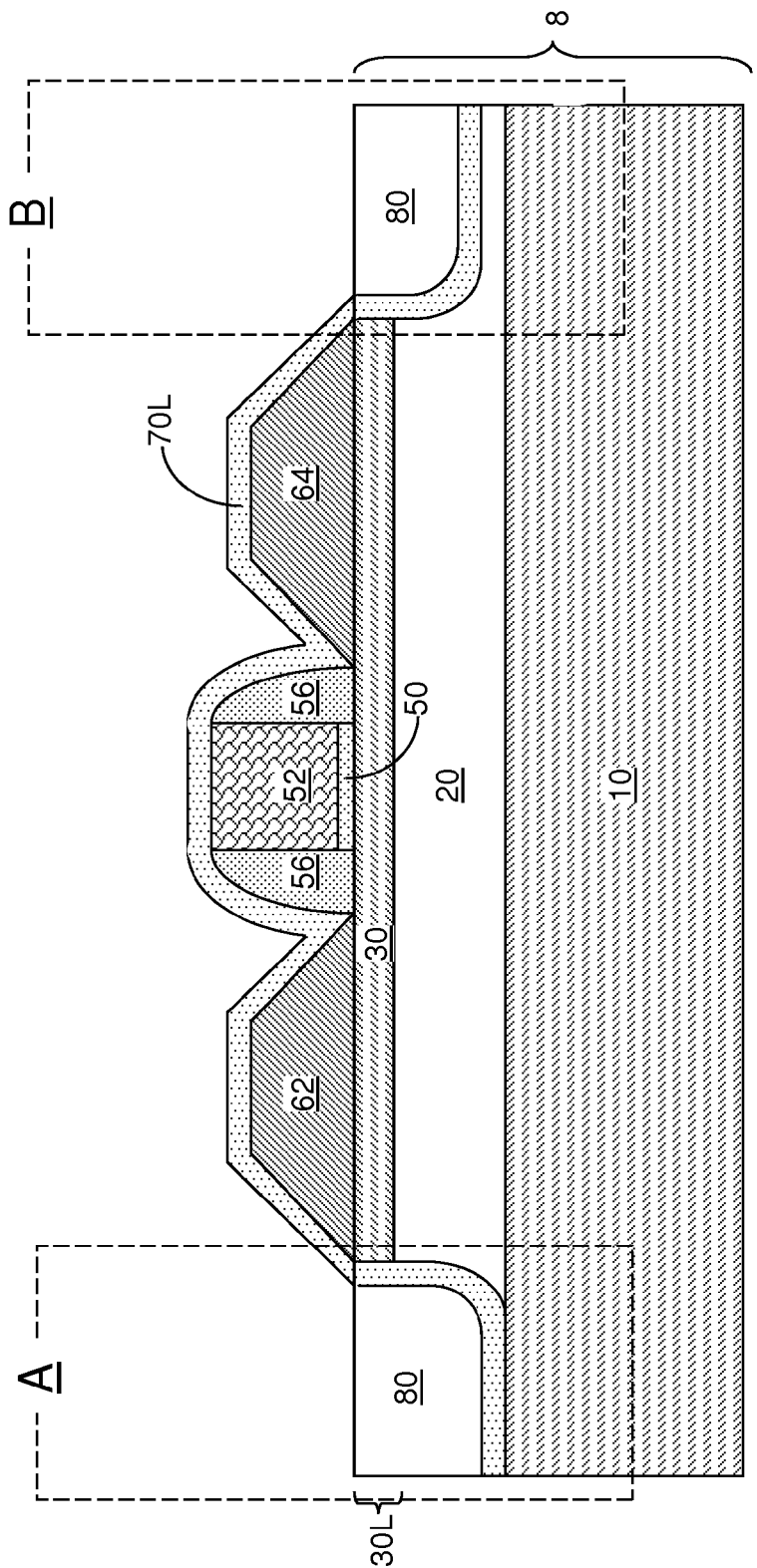
FIG. 8 is a vertical cross-sectional view of the exemplary semiconductor structure after recessing of the planarized dielectric material layer to form dielectric fill portions according to an embodiment of the present disclosure.

Referring to FIG. 8, the planarized dielectric material layer 80L is vertically recessed selective to the contiguous dielectric material liner 70L. For example, a wet etch employing a hydrofluoric acid (HF) solution or a dry etch such as a reactive ion etch employing hydrofluoric acid chemistry can be employed to remove the first dielectric material, while not etching the contiguous dielectric material liner 70L.

The recessing of the planarized dielectric material layer 80L can proceed to a level substantially coplanar with, above, or below, the level of the interface of between the gate dielectric 50 and the top semiconductor portion 30, i.e., the level of the topmost surface of the top semiconductor portion 30. The recessed top surface of the planarized dielectric material layer 80L is located at least above the level of the bottommost surface of the top semiconductor layer 30L. In one embodiment, the recessed top surface of the planarized dielectric material layer 80L can be located between the top surface of the top semiconductor portion 30 and a level corresponding to one half of the thickness of the top semiconductor portion 30. Each remaining portion of the planarized dielectric material layer 80L constitutes a dielectric fill portion 80 that includes the first dielectric material.

In one embodiment, the contiguous dielectric material liner 70L and a single contiguous dielectric fill portion 80 can contiguously and laterally surround the semiconductor material portion 40 and at least an upper portion of the buried insulator layer 20 that underlies the semiconductor material portion 30. If the contiguous dielectric material liner 70L contiguously contacts a top surface of the handle substrate 8 around the top semiconductor portion 30, i.e., if the entire periphery of the top semiconductor portion 30 has the configuration of the first representative region A, the contiguous dielectric material liner 70L and a single contiguous dielectric fill portion 80 can contiguously and laterally surround the semiconductor material portion 40 and an physically isolated portion of the buried insulator layer 20 that underlies the semiconductor material portion 30 and is laterally spaced from other portions (not shown) of the buried insulator layer 20 by the combination of the contiguous dielectric material liner 70L and the single contiguous dielectric fill portion 80.

Figure 9:
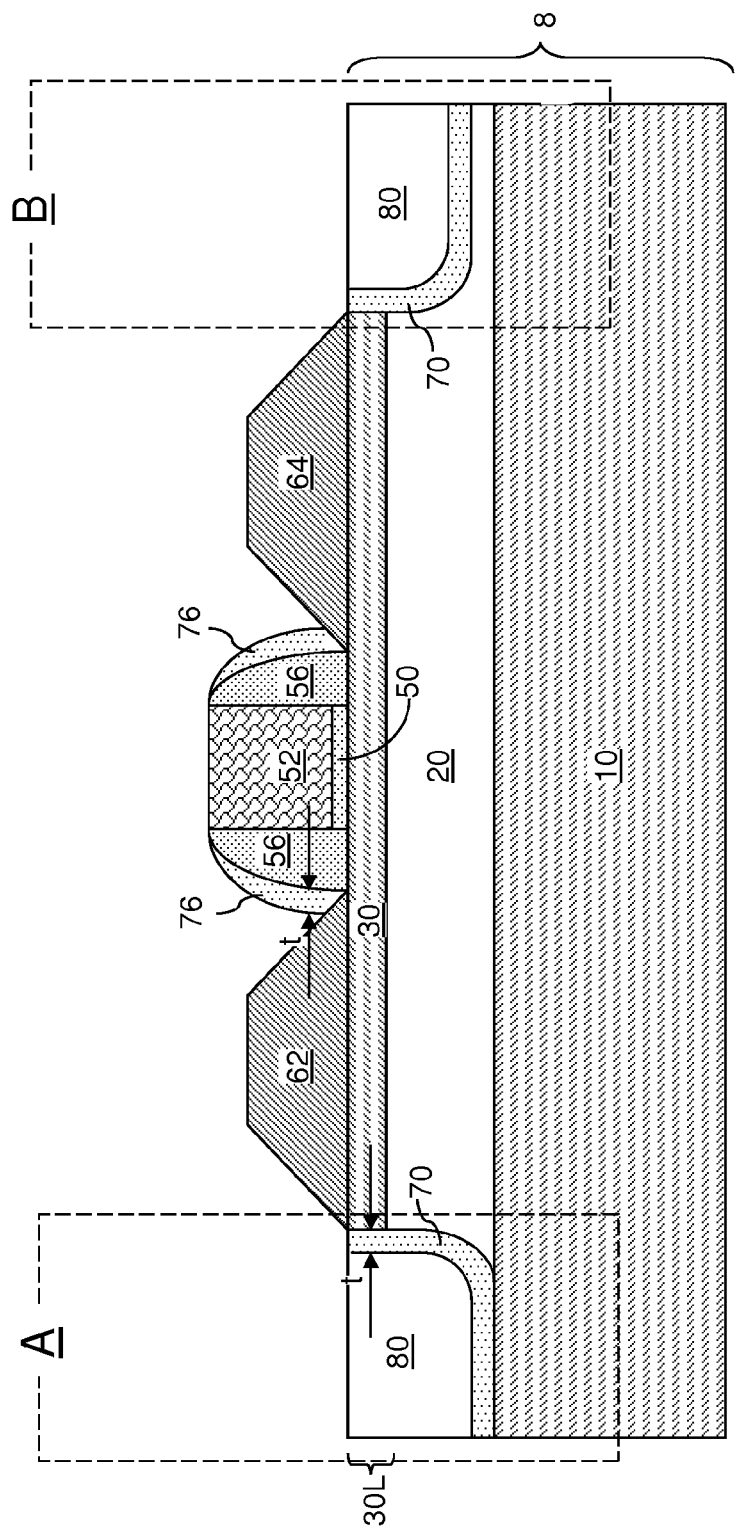
FIG. 9 a vertical cross-sectional view of the exemplary semiconductor structure after an anisotropic etch of the conformal dielectric material liner to form an outer gate spacer according to an embodiment of the present disclosure.

Referring to FIG. 9, an anisotropic etch is performed to remove horizontal portions of the contiguous dielectric material liner 70L. Each remaining portion of the contiguous dielectric material liner 70L that are embedded in the SOI substrate 8 constitutes a dielectric material liner 70 having a topmost surface that is substantially coplanar with the topmost surface of the top semiconductor portion 30. A remaining portion of the contiguous dielectric material liner 70L around the gate spacer 56 constitutes an outer gate spacer 76.

Each dielectric material liner 70 laterally contacts a sidewall of the semiconductor material portion 30 and a sidewall of at least an upper portion of a buried insulator layer 20 within the SOI substrate 8. Each dielectric fill portion 80 fills the volume inside a dielectric material liner 80. The outer gate spacer 76 is located on outer sidewalls of the gate spacer 56, and includes the same material as the dielectric material liner 70. The thickness t of the outer gate spacer 76 at a bottom portion thereof is the same as the thickness t of the dielectric material liner 70.

Figure 10:
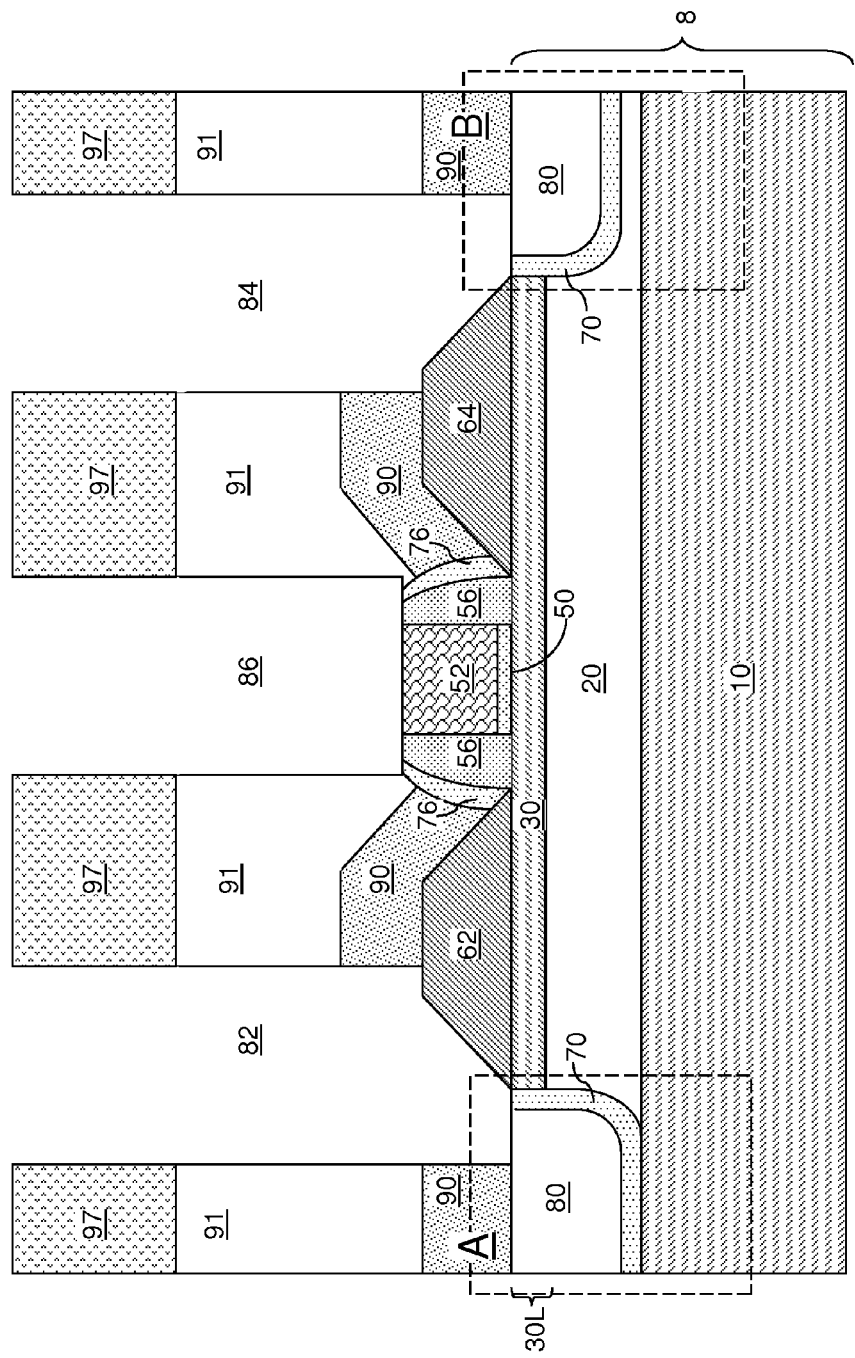
FIG. 10 is a vertical cross-sectional view of the exemplary semiconductor structure after formation of at least one contact-level dielectric layer, application and patterning of a photoresist, and formation of contact via holes according to an embodiment of the present disclosure.

Referring to FIG. 10, at least one contact-level dielectric layer is formed. In one embodiment, the at least one contact-level dielectric layer can include a first contact-level dielectric layer 90 in a bottom portion thereof, and include a second contact-level dielectric layer 91 at a top portion thereof.

The first contact-level dielectric layer 90 and the second contact-level dielectric layer 91 can be sequentially deposited. The first contact-level dielectric layer 90 includes a second dielectric material that is different from the first dielectric material. For example, the second dielectric material can be silicon nitride, non-porous organosilicate glass including Si, C, O, H, or non-porous nitrogen-doped organosilicate glass including Si, C, O, H, and N. The first contact-level dielectric layer 90 includes a non-self-planarizing material, and is not subsequently planarized. Thus, the top surface of the first contact-level dielectric layer has a topography that replicates the underlying topography underneath the first contact-level dielectric layer 90, i.e., the topography of the top surfaces of the dielectric fill portion(s) 80, the dielectric material liner 70, the raised source region 62, the raised drain region 64, the outer gate spacer 76, and the gate electrode 52. The thickness of the first contact-level dielectric layer 90 can be from 20 nm to 200 nm, although lesser and greater thicknesses can also be employed.

The second contact-level dielectric layer 91 includes a dielectric material that is different from the second dielectric material of the first contact-level dielectric layer 90. The second contact-level dielectric layer 91 can include a self-planarizing material such as spin-on glass (SOG) or a spin-on low dielectric constant material having a dielectric constant less than 3.9 (i.e., a dielectric constant less than the dielectric constant of silicon oxide). Alternately, the second contact-level dielectric layer 91 can include a non-self-planarizing material such as silicon oxide, porous or non-porous organosilicate glass including Si, C, O, and H, or porous or non-porous nitrogen-doped organosilicate glass including Si, C, O, H, and N. In this case, the top surface of the second contact-level dielectric layer 91 can be planarized, for example, by chemical mechanical planarization. Thus, the second contact-level dielectric layer 91 as planarized has a planar top surface. The thickness of the thickest portion of the second contact-level dielectric layer 91 after planarization can be from 60 nm to 600 nm, although lesser and greater thicknesses can also be employed.

A photoresist 97 is applied over the at least one contact-level dielectric layer (90, 91), and is lithographically patterned to form opening therein. At least one anisotropic etch is employed to transfer the pattern in the photoresist 97 into the at least one contact-level dielectric layer (90, 91).

In one embodiment, a first anisotropic etch that etches the dielectric material of the second contact-level dielectric layer 91 selective to the second dielectric material of the first contact-level dielectric layer 90 can be employed. Various via cavities (82, 84, 86) are formed, which extend from the top surface of the photoresist 97 to bottom surfaces of the second contact-level dielectric layer 91 (located at different levels depending on the local variation of the height of the interface between the first contact-level dielectric layer 90 and the second contact-level dielectric layer 91). A second anisotropic etch that etches the second dielectric material of the second first contact-level dielectric layer can be subsequently employed to extend the various via cavities 82 downward so that the various via cavities extend to the top surfaces of the dielectric fill portion(s) 80, the dielectric material liner 70, the raised source region 62, the raised drain region 64, and/or the gate electrode 52. In one embodiment, the etch chemistry of the second anisotropic etch can be selected such that the etch chemistry of the second anisotropic etch is selective to the first dielectric material of the dielectric fill portion(s) 80 and/or the dielectric material of the dielectric material liner 70.

In one embodiment, the various via cavities (82, 84, 86) can include a source-side via cavity 82, a drain-side via cavity 84, and a gate-side via cavity 86. The photoresist 97 is subsequently removed, for example, by ashing.

Figure 11:
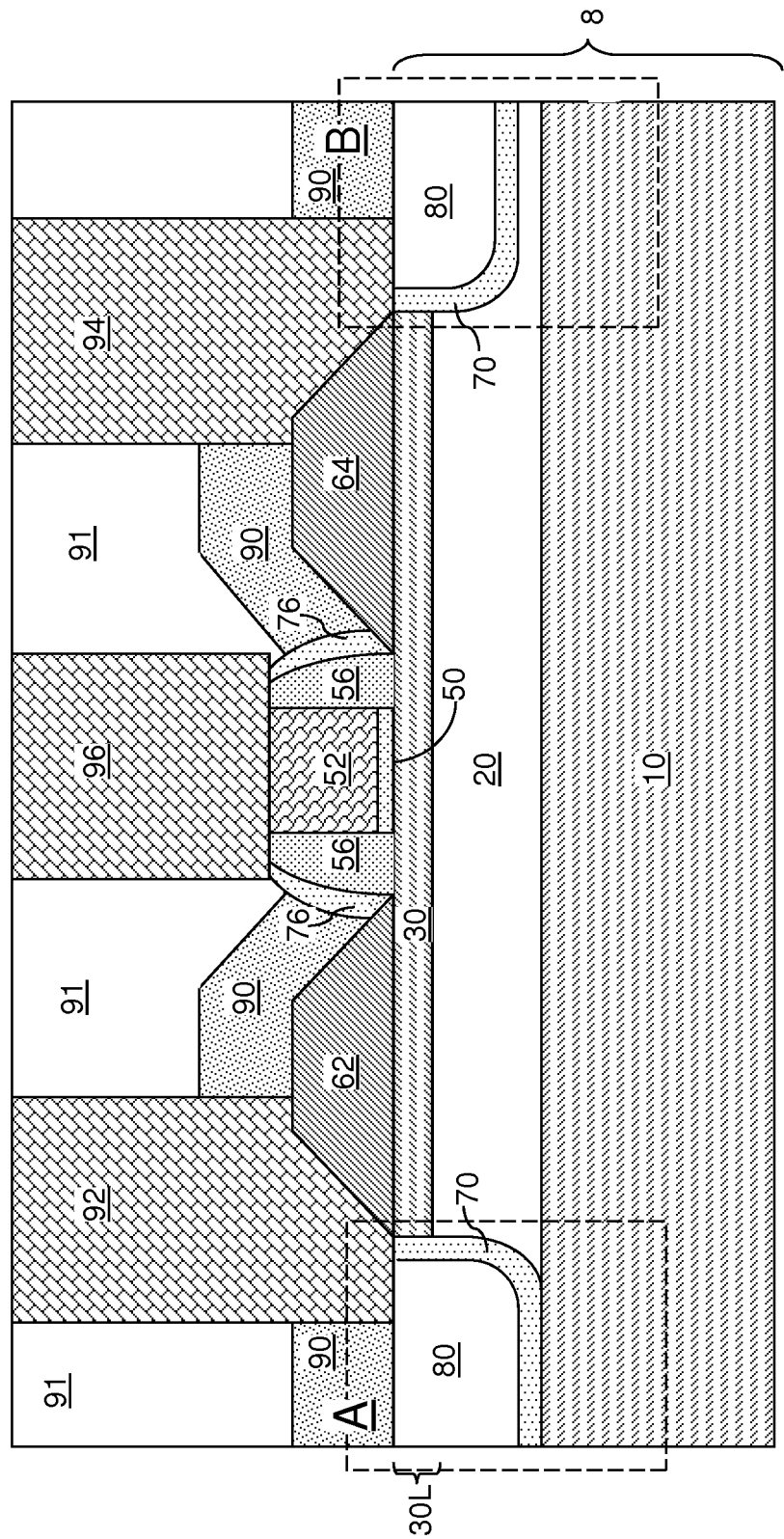
FIG. 11 is a vertical cross-sectional view of the exemplary semiconductor structure after formation of contact via structures according to an embodiment of the present disclosure.

Referring to FIG. 11, various contact via structures are formed by filling the various via cavities (82, 84, 86) with a conductive material. For example, a conductive material such as a metallic material or a doped semiconductor material can be deposited in the various via cavities (82, 84, 86), for example, by physical vapor deposition (PVD), chemical vapor deposition (CVD), atomic layer deposition (ALD), electroplating, electroless plating, or a combination thereof. Excess conductive material above the top surface of the at least one contact-level dielectric layer (90, 91) is removed, for example, by a recess etch and/or chemical mechanical planarization. The various contact via structures can include, for example, a source-side contact via structure 92, a drain-side contact via structure 94, and a gate-side contact via structure 96.

Because of the presence of the dielectric fill portion(s) 80, the dielectric material liner 70, the source-side via cavity 82 and the drain-side via cavity 84, and consequently, the source-side contact via structure 92 and the drain-side contact via structure 94 do not extend to the handle substrate 10. In one embodiment, the bottommost surfaces of the source-side contact via structure 92 and the drain-side contact via structure 94 are located above the level of the bottommost surface of the top semiconductor layer 30L, i.e., above the topmost surface of the buried insulator layer 20.

Some of the various contact via structures (92, 94, 96) can be in physical contact with a component of a device on the top semiconductor layer 30L, a dielectric material liner 70, a dielectric fill portion 80, and the at least one contact-level dielectric layer (90, 91) as in the case of the source-side contact via structure 92 and the drain-side contact via structure. For example, the component of a device that the source-side contact via structure 92 contacts can be the raised source region 62 of the field effect transistor, and the component of a device that the drain-side contact via structure 94 contacts can be the raised drain region 64 of the field effect transistor. The interface between the source-side contact via structure 92 and a dielectric fill portion 80 is coplanar with the interface between the source-side contact via structure 92 and the first contact-level dielectric layer 90. Likewise, the interface between the drain-side contact via structure 94 and a dielectric fill portion 80 is coplanar with the interface between the drain-side contact via structure 94 and the first contact-level dielectric layer 90.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising:
   forming a gate stack and a gate spacer laterally surrounding said gate stack on a top semiconductor layer in a semiconductor-on-insulator (SOI) substrate;
   performing at least one processing step on said SOI substrate after forming said gate spacer, wherein at least one recessed region having a bottom surface below a level of a bottommost surface of said top semiconductor layer is formed through a portion of said top semiconductor layer and at least in an upper portion of a buried insulator layer in said SOI substrate;
   forming a dielectric material liner on sidewalls and a bottom surface of said at least one recessed region and over said gate spacer and said gate stack; and
   forming at least one dielectric fill portion that fills said recessed region at least above said level of said bottommost surface of said top semiconductor layer.

2. The method of claim 1, wherein said at least one dielectric fill portion comprises a first dielectric material, and said method further comprises:
   forming at least one dielectric material layer over said at least one dielectric fill portion, wherein a bottommost portion of said at least one dielectric material layer comprises a second dielectric material that is different from said first dielectric material; and
   forming contact via holes in said at least one dielectric material layer employing an etch chemistry that etches said second dielectric material selectively to said first dielectric material.

3. The method of claim 2, further comprising forming contact via structures in said contact via holes, wherein a bottommost portion of said contact via holes is located above said level of said bottommost surface of said top semiconductor layer.

4. The method of claim 2, wherein said dielectric material liner comprises at least one of silicon nitride and a dielectric metal oxide, said first dielectric material comprises silicon oxide, and said second dielectric material comprises silicon nitride.

5. The method of claim 1, wherein said at least one processing step comprises forming a raised source region and a raised drain region around said gate spacer by selective deposition, wherein a semiconductor material is deposited on semiconductor surfaces of said top semiconductor layer and is not deposited on dielectric surfaces during said selective deposition.

6. The method of claim 5, wherein said at least one recessed region is formed at a periphery of said raised source region and at a periphery of said raised drain region.

7. The method of claim 1, wherein said dielectric material liner is deposited conformally, and said method further comprises anisotropically etching said dielectric material liner after formation of said at least one dielectric fill portion and prior to formation of at least one dielectric material layer over said at least one dielectric fill portion, wherein a remaining portion of said dielectric material liner forms an outer gate spacer around said gate spacer.

8. The method of claim 1, wherein said SOI substrate includes a vertical stack, from bottom to top, of a handle substrate, a buried insulator layer, and said top semiconductor layer, and a surface of said handle substrate is physically exposed at a bottom of one of said at least one recessed region.

9. The method of claim 1, wherein said SOI substrate includes a vertical stack, from bottom to top, of a handle substrate, a buried insulator layer, and said top semiconductor layer, and a bottommost portion of said dielectric material liner is located above, and is vertically spaced from, said handle substrate.

10. The method of claim 1, wherein said at least one dielectric fill portion is formed by:
    forming a dielectric material layer over said dielectric material liner;
    planarizing said dielectric material layer; and
    vertically recessing a top surface of said planarized dielectric material layer, wherein each of said at least one dielectric fill portion is a remaining portion of said planarized dielectric material layer.

11. The method of claim 1, further comprising forming a shallow trench isolation structure by replacing a portion of said top semiconductor layer with a dielectric material prior to forming said gate stack, wherein an entirety of said shallow trench isolation structure is removed before or during said at least one processing step, and said at least one recessed region includes an entirety of a volume previously occupied by said shallow trench isolation structure.

* * * * *